METHOD OF TREATING SEMI-CONDUCTOR DEVICES AND DEVICES PRODUCED THEREBY
Filed June 23, 1954
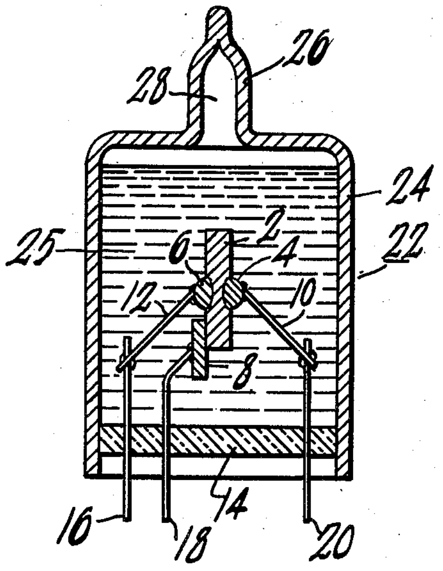
INVENTOR.
Sidney G. Ellis
BY J. L. Whittaker
ATTORNEY United States Patent Office 2,812,480

Patented Nov. 5, 1957

2,812,480

METHOD OF TREATING SEMI-CONDUCTOR DEVICES AND DEVICES PRODUCED THEREBY

Sidney G. Ellis, Princeton Junction, N. J., assignor to Radio Corporation of America, a corporation of Delaware Application June 23, 1954, Serial No. 438,688

7 Claims. (Cl. 317—240)

This invention relates to improved semi-conductor devices and more particularly to improved surface treatments for devices that include semi-conductive bodies of silicon.

In semi-conductor devices such as transistors, crystal rectifiers and photocells that include bases of semi-conductive materials, it is known that the condition of the surfaces of the bases is critical. For many devices, and especially for transistors, it is desirable to provide semi-conductor bases having the following surface characteristics:

(1) A low surface recombination velocity "*s*," i. e., minority charge carriers in the material should not readily combine at the surface with majority charge carriers and thereby disappear.

(2) Freedom from contaminating conductive layers which would tend to short-circuit the rectifying action of a barrier in the device and to lower its breakdown voltage.

(3) A high degree of stability so that the device may be operated for relatively long periods of time without any substantial change in electrical or physical properties.

Many different surface treatments have been previously suggested to improve semi-conductor devices having germanium bases. For example, such surface treatment may comprise forming a surface oxide film on the germanium body of a device by immersing the device in a solution of hydrofluoric acid and hydrogen peroxide and then exposing the surface film to fumes of hydrofluoric acid. Comparably effective surface treatments for devices including bodies of semi-conductive silicon have not previously been known. Silicon is a relatively refractory material and forms a difficultly removable oxide film upon its surface when exposed to air. The surface recombination velocities typically found in silicon devices are relatively high, generally being in the neighborhood of about 4000 cm. per second as compared to a velocity of 50 cm. per second in germanium devices treated according to the method described heretofore.

Accordingly, one object of the instant invention is to provide improved semi-conductor devices.

Another object is to provide improved semi-conductor devices including a body of semi-conductive silicon.

Another object is to provide improved silicon semi-conductor devices having improved surface characteristics.

Another object is to provide improved methods of treating silicon semi-conductor devices.

Another object is to improve the long term stability of silicon semi-conductor devices.

Still another object is to provide improved methods of reducing the surface recombination velocities of minority charge carriers in silicon semi-conductor bodies.

A further object is to provide improved methods of treating the surfaces of silicon semi-conductor devices to reduce the surface recombination velocities of minority charge carriers in said devices.

These and other objects are accomplished by the instant invention which provides improved surface treatments for silicon semi-conductor devices. In particular it has now been found that the electrical characteristics of silicon semi-conductor devices are improved by maintaining the devices in contact with relatively dilute iodine or bromine. The iodine or bromine may be in the form of a vapor or, alternatively, may be dissolved in a liquid such as toluene or a solid such as an inert resin.

The invention will be described in greater detail by reference to the accompanying drawing of which the single figure is a schematic, cross-sectional, elevational view of a device according to a preferred embodiment of the invention.

A transistor device including a base of semi-conductive silicon may be treated according to a preferred embodiment of the invention to improve its electrical characteristics. A typical transistor device of the alloy junction type may be made by surface alloying two indium electrodes upon opposite surfaces of an n-type semi-conductive silicon wafer. The wafer is preferably cut from a single crystal of n-type silicon of about 1 ohm-cm. resistivity and may be about 0.1" x .085" x .01" think. It is initially etched in hydrofluoric acid to reduce its thickness to about .006" and to expose a fresh, clean, crystallographically undisturbed surface. Electrode-forming pellets of indium are placed in co-axial alignment with each other upon opposite surfaces of the wafer. The ensemble is heated in an inert or reducing atmosphere for about five minutes at about 700° C. to melt the pellets and to alloy them into the wafer to form two closely adjacent aligned p-n rectifying junctions therein.

The surfaces of such a device are generally contaminated as by material deposited upon them during heating. In particular the peripheral edges of the junctions or barriers lying upon the surface may be contaminated by such deposited material and also by material of the pellets that flows along the surface during heating. Contamination of the exposed portions of the junctions is particularly disadvantageous since it may provide electrical leakage paths which effectively short circuit the junctions. Contamination of the remaining surfaces of the wafer serves to increase the surface recombination velocity and thus adversely to affect the operation of the device. Mere exposure to the atmosphere after firing also appears to contaminate the surface, possibly because of the formation of a film of moisture upon the surface.

According to the invention, after the device is formed it is treated with hot sodium or potassium hydroxide solution to etch the surface and to remove any contaminating matter therefrom. The alkali also dissolves and removes any oxide film that may exist upon the surface. The device is then immersed in an atmosphere of iodine or bromine. The iodine or bromine may be present in the form of a vapor or, alternatively, may be dissolved in a solvent. Oxygen is preferably excluded from contact with the device in order to prevent the formation of a new oxide film on the silicon surface. Such an oxide film, even in the presence of iodine or bromine, tends to increase the surface recombination velocity in the device. If the iodine or bromine is contacted to the device by dissolving it in a solvent, the solvent may be any non-oxidizing liquid or resin that is chemically inert with respect to silicon and to iodine and bromine. To avoid adverse electrical effects upon the operation of the device the solvent should also be electrically insulating.

An illustrative device according to the invention is shown in the drawing. It comprises a base 2 of n-type semi-conductive silicon, a pair of oppositely disposed rectifying electrodes 4 and 6 upon the base and a base tab 8 attached to the base by a non-rectifying solder connection. A pair of electrical leads 10 and 12 contact the rectifying electrodes. The device is mounted within a hermetically sealed container 22. The container may comprise, for example, three lead wires 16, 18 and 20 sealed through a glass or ceramic stem base 14. The device is supported by the stem leads which are welded or soldered to the base tab and to the electrode leads 10 and 12 respectively. A tubular member 24 which may be of nickel, steel or any other sealable material is sealed to the glass stem base. The end of the tubular member opposite the base is provided with a neck 26 which may be sealed off as shown in the drawing by pressure or by soldering.

According to the invention the silicon device is first mounted upon the stem and etched in hot alkali to remove surface impurities and oxide films. The tubular member is then sealed over the stem to form a container about the device. By means of a hypodermic needle inserted through the neck, the container is filled with a saturated solution of iodine in carbon tetrachloride. The filled container is then heated to a temperature at least as high as the maximum temperature to which the device will be subjected in operation. The heating causes the carbon tetrachloride to expand to a volume which will substantially completely fill the interior of the container under operating conditions. The neck of the tube is sealed before the device is cooled. After the device cools to room temperature the carbon tetrachloride contracts and leaves a space 28 which is saturated with carbon tetrachloride and iodine vapors and into which the carbon tetrachloride expands when again heated.

The iodine, or bromine, may be dissolved in a resin instead of a liquid. For example, an epoxyline resin such as Araldite CN–502 may be dissolved in a saturated solution of iodine in methyl-ethyl-ketone and toluene (50%–50%), and the resulting solution painted on the surface of a silicon device. The methyl-ethyl-ketone and toluene evaporate leaving a film of iodine-containing resin on the surface.

Alternatively the container may be filled with an inert or reducing gas such as hydrogen or argon and a small crystal of iodine or a drop of bromine placed in the container with the silicon device to provide an atmosphere rich in iodine or bromine. A second alternative is to place a drop of bromine or a crystal of iodine in the container and then to evacuate the container to remove substantially all air from it leaving the silicon device in an atmosphere of relatively pure iodine or bromine.

It is preferred, however, to dissolve the iodine or bromine in a liquid such as carbon tetrachloride or toluene because of the relative ease of filling the container with a liquid as compared with the difficulty of filling it with a gas or evacuating it. The liquid surrounding the device also acts as a heat conductor to conduct heat away from the device during operation.

Maintaining the device in contact with iodine or bromine substantially reduces the surface recombination velocity of the minority charge carriers in the silicon. In some instances the recombination velocity is reduced from a normal value of about 4000 cm. per second to about 700 cm. per second. If the device is removed from contact with the iodine or bromine the recombination velocity increases again to its previous relatively high value. It is also important to maintain the device free from contact with oxygen or other oxidizing agents. Otherwise, even in the presence of iodine or bromine, an oxide film is formed upon the surface of the silicon. Such an oxide film serves to increase the surface recombination velocity.

The concentration of iodine or bromine in the medium surrounding the device is not critical. In a vapor medium where the liquid or solid is also present the concentration is, of course, determined by the vapor pressure of the iodine or bromine and varies according to the temperature. In a liquid or solid medium a solution of any desired concentration may be used, from a dilute solution in which the violet color of iodine or the red color of bromine is just discernible up to a saturated solution.

The practice of the invention is applicable to other devices utilizing silicon and is not limited to the specific embodiment heretofore described. For example, the invention may be utilized to reduce the surface recombination velocities in bodies of p-type as well as n-type semiconductive silicon, and of silicon bodies utilized in point contact transistors and rectifiers as well as large area junction devices. The practice of the invention is also effective to reduce the surface recombination velocity of minority charge carriers in semi-conductive germanium but with less advantage because alternative treatments are available in the case of germanium.

What is claimed is:

1. A method of treating a surface of a body of semiconductive silicon to improve the electrical properties of said body comprising maintaining said surface free from oxygen and at least one substance of the class consisting of iodine and bromine in contact with said surface.

2. The method according to claim 1 in which said substance is in vapor form.

3. The method according to claim 1 in which said substance is dissolved in an organic insulating solvent which is non-oxidizing and chemically inert with respect to silicon and to said substance.

4. A semi-conductor device including a body of semiconductive silicon, an envelope to enclose said device, and a substance selected from the group consisting of iodine and bromine maintained in contact with the surface of said device by said envelope.

5. A device according to claim 4 in which said envelope is a sealed container and said substance in contact with said surface is a vapor.

6. A device according to claim 4 in which said substance in contact with said surface is dissolved in an organic, insulating solvent, said solvent also contacting said surface.

7. A method of treating a surface of a body of semiconductive silicon to improve the electrical properties of said body comprising the steps of: dissolving a substance selected from the class consisting of iodine or bromine in a 50% solution of methyl-ethyl-ketone and toluene, dissolving an epoxyline resin in said solution, applying said resin-containing solution to said surface, and evaporating said methyl-ethyl-ketone and toluene whereby a film of said resin containing said substance remains on said surface.

References Cited in the file of this patent

UNITED STATES PATENTS

| | | |
|---|---|---|
| 197,088 | Boynton | Nov. 13, 1877 |
| 2,375,355 | Fahraeus et al. | May 8, 1945 |
| 2,664,528 | Stelmak | Dec. 29, 1953 |